(12) United States Patent
Chao et al.

(10) Patent No.: US 10,505,088 B2
(45) Date of Patent: Dec. 10, 2019

(54) LIGHT EMITTING DIODE PACKAGING STRUCTURE

(71) Applicant: XIAMEN SANAN OPTOELECTRONICS TECHNOLOGY CO., LTD., Xiamen (CN)

(72) Inventors: Chih-Wei Chao, Xiamen (CN); Yen-Chih Chiang, Xiamen (CN)

(73) Assignee: XIAMEN SANAN OPTOELECTRONICS TECHNOLOGY CO., LTD., Xiamen (CN)

(*) Notice: Subject to any disclaimer, the term of this patent is extended or adjusted under 35 U.S.C. 154(b) by 108 days.

(21) Appl. No.: 15/055,624

(22) Filed: Feb. 28, 2016

(65) Prior Publication Data

US 2016/0181490 A1    Jun. 23, 2016

Related U.S. Application Data

(63) Continuation of application No. 14/742,538, filed on Jun. 17, 2015, now Pat. No. 9,306,138, which is a (Continued)

(30) Foreign Application Priority Data

Apr. 8, 2013   (CN) .......................... 2013 1 0119165
Apr. 8, 2013   (CN) .......................... 2013 1 0119249

(51) Int. Cl.
| H01L 33/60 | (2010.01) |
| H01L 33/34 | (2010.01) |
| H01L 33/48 | (2010.01) |
| H01L 33/38 | (2010.01) |
| H01L 33/50 | (2010.01) |

(Continued)

(52) U.S. Cl.
CPC .............. *H01L 33/60* (2013.01); *H01L 33/34* (2013.01); *H01L 33/385* (2013.01); *H01L 33/46* (2013.01); *H01L 33/483* (2013.01); *H01L 33/50* (2013.01); *H01L 33/20* (2013.01); *H01L 33/486* (2013.01); *H01L 33/62* (2013.01); *H01L 33/642* (2013.01)

(58) Field of Classification Search
None
See application file for complete search history.

(56) References Cited

U.S. PATENT DOCUMENTS 6,410,942 B1 *   6/2002   Thibeault ................ H01L 33/08
                                                              257/88
8,575,646 B1 *  11/2013   Shum ...................... H01L 33/54
                                                             257/100

(Continued)

*Primary Examiner* — Walter H Swanson
*Assistant Examiner* — Kien C Ly
(74) *Attorney, Agent, or Firm* — Syncoda LLC; Feng Ma

(57) ABSTRACT

A packaging structure of a vertical LED chip includes at least a support system, a glue cup that connects to periphery of the support system, a LED chip with light absorption substrate over the support system and packaging glue distributed in periphery of the LED chip. The light absorption substrate has a side forming a bubble structure at an interface with the packaging glue. A reflecting layer is formed from material refractivity difference of the packaging glue, the bubble structure and the light absorption substrate for eliminating or reducing light absorption by the substrate.

9 Claims, 7 Drawing Sheets

Related U.S. Application Data continuation of application No. PCT/CN2014/071041, filed on Jan. 22, 2014, and a continuation of application No. PCT/CN2014/071040, filed on Jan. 22, 2014.

(51) Int. Cl.
*H01L 33/46* (2010.01)
*H01L 33/20* (2010.01)
*H01L 33/62* (2010.01)
*H01L 33/64* (2010.01)

(56) References Cited

U.S. PATENT DOCUMENTS

| | | | |
|---|---|---|---|
| 9,252,348 B2* | 2/2016 | Oh | H01L 25/0753 |
| 2002/0105268 A1* | 8/2002 | Schliep | H01L 33/60 |
| | | | 313/512 |
| 2010/0301357 A1* | 12/2010 | Chen | H01L 33/56 |
| | | | 257/98 |
| 2012/0112220 A1* | 5/2012 | West | H01L 33/60 |
| | | | 257/98 |
| 2013/0037842 A1* | 2/2013 | Yamada | H01L 33/60 |
| | | | 257/98 |
| 2013/0063024 A1* | 3/2013 | Wada | H01L 33/56 |
| | | | 313/512 |
| 2014/0168942 A1* | 6/2014 | Kishimoto | F21S 48/214 |
| | | | 362/84 |
| 2014/0226345 A1* | 8/2014 | Song | H01L 33/62 |
| | | | 362/382 |
| 2014/0231841 A1* | 8/2014 | Wang | H01L 33/12 |
| | | | 257/98 |
| 2014/0307435 A1* | 10/2014 | Guo | F21K 9/54 |
| | | | 362/235 |

* cited by examiner

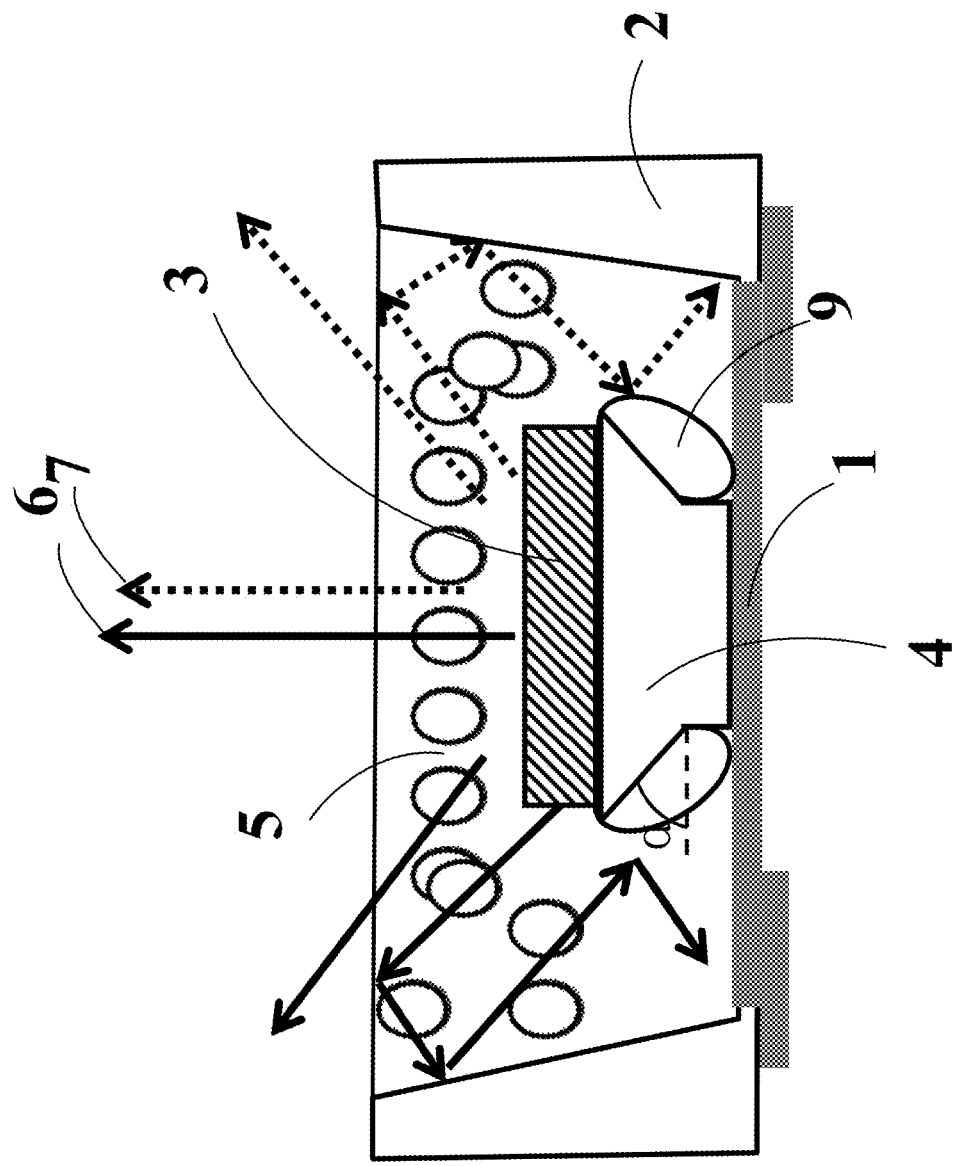

LIGHT EMITTING DIODE PACKAGING STRUCTURE

CROSS-REFERENCE TO RELATED APPLICATIONS

The present application is a continuation of, and claims priority to, U.S. patent application Ser. No. 14/742,538 filed on Jun. 17, 2015, which is a continuation of, and claims priority to, PCT/CN2014/071040 filed on Jan. 22, 2014, which claims priority to Chinese Patent Application No. 201310119165.6 filed on Apr. 8, 2013, and PCT/CN2014/071041 filed on Jan. 22, 2014, which claims priority to Chinese Patent Application on No. 201310119249.X filed on Apr. 8, 2013. The disclosures of these applications are hereby incorporated by reference in their entirety.

BACKGROUND

LED chips can generally be divided into three types by structure, i.e., standard LED chip, inverted LED chip and vertical LED chip. Currently, the standard LED chip is mostly widely applied for its low fabrication method and high yield. However, it cannot meet high-power requirements from flashlight LED lamp bead of popular smart phones in recent years. Under this background, it becomes a trend to develop vertical LED chip capable of large power. In general, thanks to vertical electrode design, the power of vertical LED chip is about 1.5 times of that of the standard LED chip. However, the vertical LED chip with vertical electrode also requires a conductive substrate. In consideration of cost performance, Si substrate is a perfect choice.

In traditional vertical LED chip packaging structure with Si substrate, as shown in FIG. 1, the blue light provided by LED chip enters to the packaging glue to stimulate yellow light and the mixture of blue light and yellow light will produce white light. While the blue light enters to the packaging glue particle, the packaging glue particle only absorbs part of blue light and the remaining blue light will be refracted to the next packaging glue particle. Therefore, during a series of light mixtures, the blue light will be continuously refracted and change its optical path. Some blue light will even be refracted back to the chip. Since Si substrate will absorb all light within visible light range, including the blue light and yellow light, when the vertical LED is used in lighting system, e.g., packaged LED lamp head, it will reduce conversion efficiency from blue light to white light and reduce luminance.

SUMMARY

The present disclosure aims at providing a LED packaging structure to improve luminance of vertical LED with an improved support system.

According to a first aspect of present disclosure, a LED packaging structure, comprising at least a support system, a glue cup that connects to periphery of the support system, a LED chip with light absorption substrate over the support system and packaging glue distributed in periphery of the LED chip. In some implementations, the support system comprises a baffle that surrounds the outer side wall of the light absorption substrate.

The support system is mainly for bearing the LED vertical chip of the light absorption substrate; the glue cup is connected to the periphery of the support system and the shape of the glue cup can be adjusted based on light shape controlling requirements; the LED chip can be placed over the support system with die bonding; the packaging glue can be distributed in periphery of the LED chip through coating; the baffle is used for eliminating or preventing the light reflected by LED chip from being absorbed by the light absorption substrate and reflecting such light out of the packaging substrate.

In some implementations, the baffle can be integrated with the support system with pressurizing or channel opening.

In some implementations, the support system is a metal support and the baffle is over the metal support, both of which are fabricated separately. The metal support is for electrode conduction or heat dissipation.

Further, periphery size of the baffle is larger than or equals to that of the LED chip; some gaps are between the light absorption substrate and the baffle for the convenience of placing the LED chip with light absorption substrate in the metal support of with encircling baffle. Further, the gap between the light absorption substrate and the baffle is filled with reflective material.

Further, height of the baffle is more than or equals to ½ thickness of the light absorption substrate and is less than or equals to thickness of the light absorption substrate for the convenience that the side of LED chip with light absorption substrate can be partially or entirely cladded by the encircling baffle.

Further, the baffle is a distributed Bragg reflecting layer, a metal reflecting layer, an omni-directional reflecting layer or a glue cup coated with reflective material.

Further, the light absorption substrate can be Si substrate or GaAs substrate.

In some embodiments, the encircling baffle can also directly clad the light absorption substrate with no gap between them.

Further, side wall of the light absorption substrate has a first side and a second side, in which, the first side is approximate to the LED chip and has an inclined angle with the level surface and the second side is far from the LED chip and is vertical to the level surface. Further, the inclined angle ranges from 30° to 85°.

In the above packaging structure, adding of a baffle structure in the support system of the packaging structure can effectively prevent light from being absorbed by the light absorption substrate and reflect such light out of the packaging structure, thus increasing probability of light emitting and improving light intensity of the vertical LED chip.

According to a second aspect of present disclosure, a LED packaging structure, comprising at least a support system, a glue cup that connects to periphery of the support system, a LED chip with light absorption substrate over the support system and packaging glue distributed in periphery of the LED chip; the substrate side forms a bubble structure with the packaging glue interface; a reflecting layer is formed by taking advantage of material refractivity difference of the packaging glue, bubble and the light absorption substrate for eliminating or preventing the light reflected by LED chip from being absorbed by the substrate and reflecting such light out of the packaging substrate.

Preferably, hydrophilic material is plated between the bubble structure and the side of the light absorption substrate.

Preferably, the light absorption substrate has a vertical side.

Preferably, the end of the light absorption substrate that is approximate to the LED chip has an inclined angle with the level surface and the section gets narrower from up to bottom.

Preferably, side wall of the light absorption substrate has a first side and a second side, in which, the first side is approximate to the LED chip and has an inclined angle with the level surface and the second side is far from the LED chip and is vertical to the level surface.

Preferably, the inclined angle ranges from 5° to 85°.

In the above packaging structure, a bubble structure is formed between the side of the light absorption substrate in the packaging structure and the packaging glue interface; and a reflecting layer is formed by taking advantage of material refractivity difference of the packaging glue, bubble and the Si substrate for effectively eliminating or preventing the light from being absorbed by the substrate and reflecting such light out of the packaging structure, thus increasing probability of light emitting and improving light intensity of the vertical LED chip.

The packaging structure in this present disclosure is suitable for lighting system, in particular for packaging into LED lamp bead.

BRIEF DESCRIPTION OF THE DRAWINGS

FIG. 7 is a section diagram of LED packaging structure of Embodiment 7.

In the drawings:

1: Metal support; 2: Glue cup; 3: LED chip; 4: Light absorption substrate; 5: Packaging glue; 6: Blue light (solid line); 7: Yellow light (dotted line); 8: Encircling baffle structure; 9: Bubble structure.

DETAILED DESCRIPTION

The embodiments of the present disclosure will be described with reference to the accompanying figures and embodiments.

Embodiment 1

Figure 1:
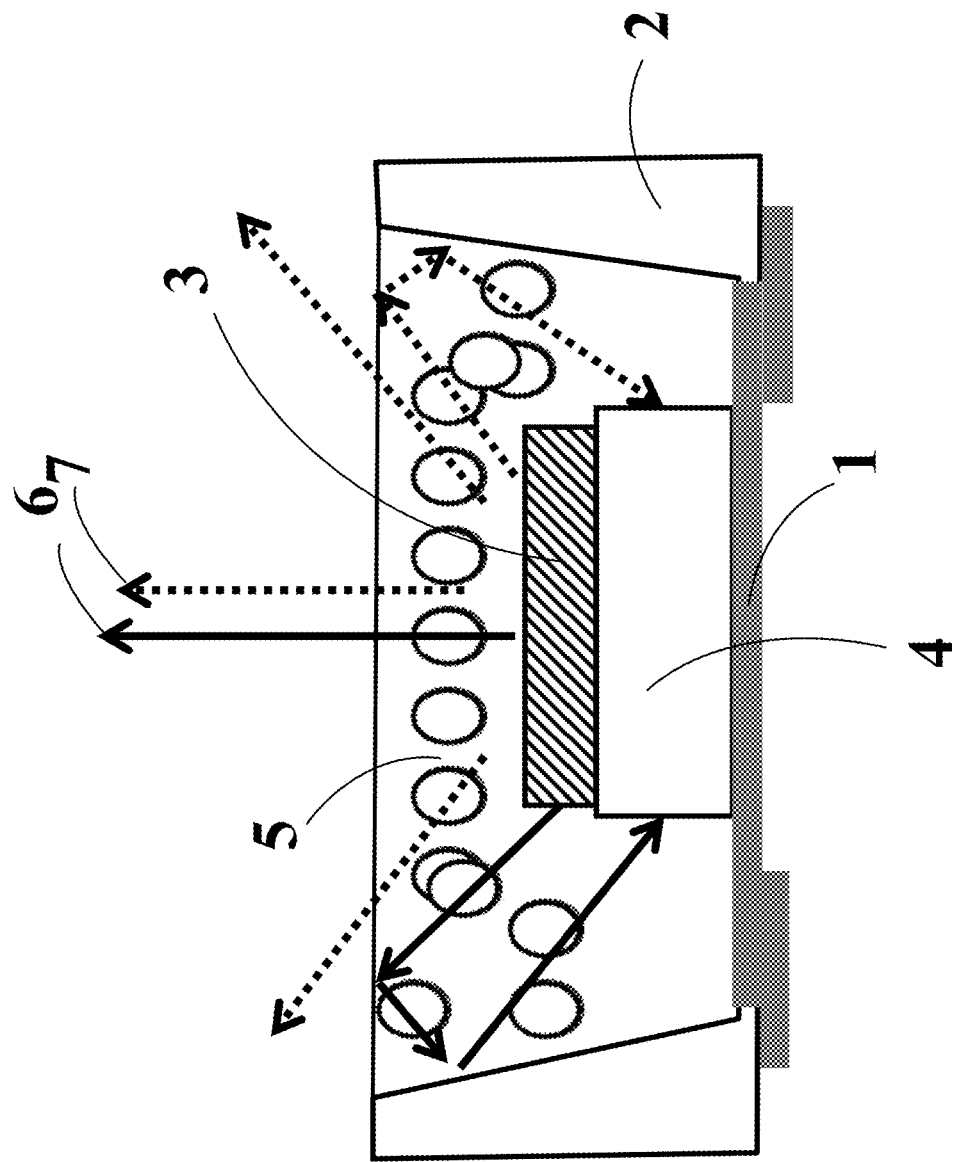
FIG. 1 is a packaging structure of LED vertical chip of a conventional Si substrate.
Figure 2:
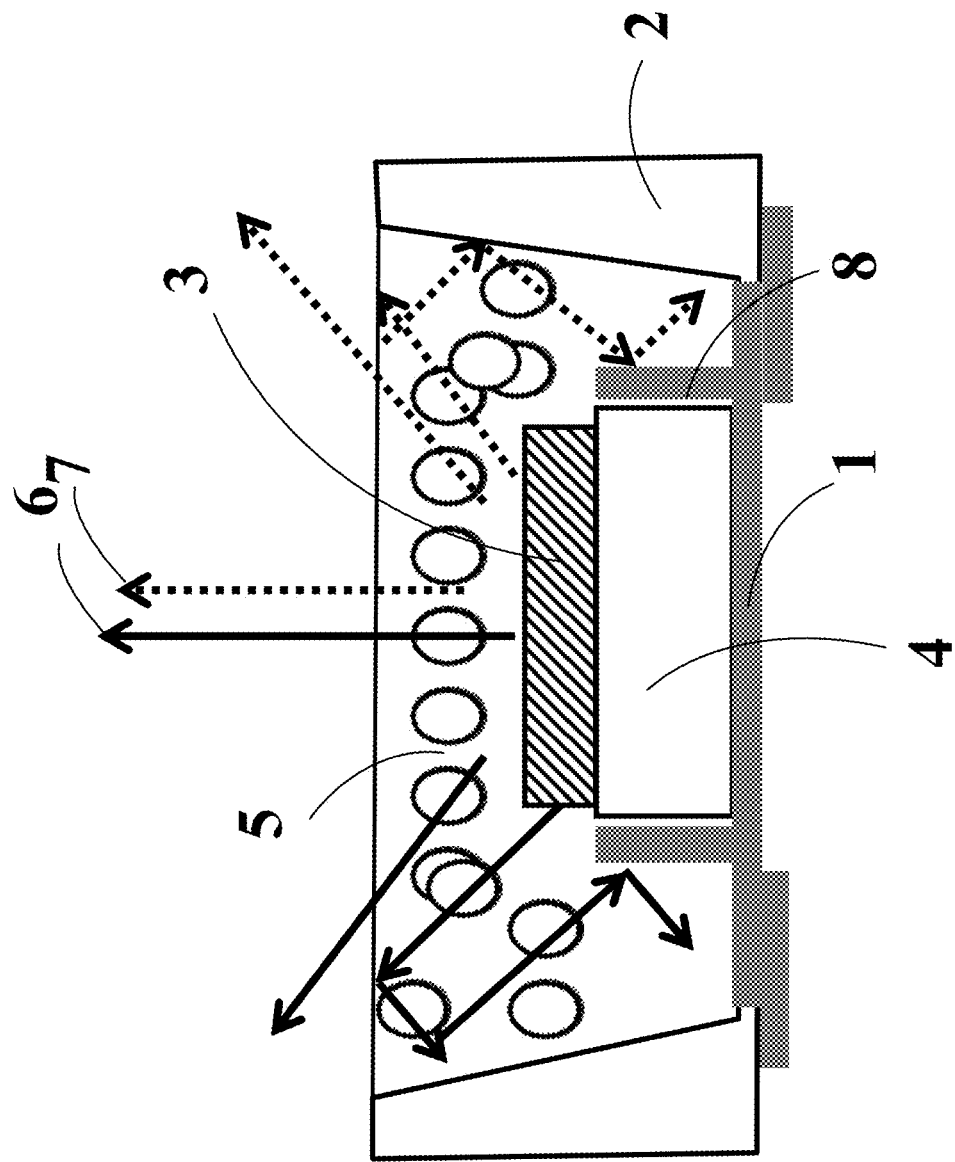
FIG. 2 is a section diagram of LED packaging structure of Embodiment 1.

With reference to FIG. 2, a LED packaging structure, comprising a support system, mainly used for bearing the Si substrate LED vertical chip 3, and the support system is fabricated into an integral metal support 1 with an encircling baffle structure 8 through channel opening, in which, the metal support 1 is used for electrode conduction or heat dissipation and the encircling baffle structure 8 is used for eliminating or preventing light reflected by the LED vertical chip 3 being absorbed by the Si substrate 4 and reflecting such light out of the packaging structure; wherein, height of the encircling baffle is equal to thickness of the Si substrate LED chip; glue cup 2 is connected to periphery of the support system and shape of the glue cup can be adjusted based on light shape controlling requirements; the LED vertical chip 3 is placed over the support system through die bonding; the packaging glue with yellow YAG phosphor 5 is evenly distributed over the Si substrate LED chip 3 through coating.

In the above LED packaging structure, size of the encircling baffle structure is to be corresponding to that of the Si substrate LED vertical chip, i.e., periphery size of the encircling baffle structure is larger than or equals to that of the Si substrate LED vertical chip; some gaps are between the Si substrate 4 and the encircling baffle for the convenience of placing the Si substrate LED chip in the metal support of with encircling baffle.

With reference to FIG. 2, a LED packaging structure with an encircling baffle structure can effectively prevent blue light 6 and yellow light 7 from being absorbed by the Si substrate 4 and reflect such light out of the packaging structure, thus improving light intensity of the vertical LED chip. This packaging structure is suitable for lighting system, in particular for packaging into LED lamp bead.

Embodiment 2

Figure 3:
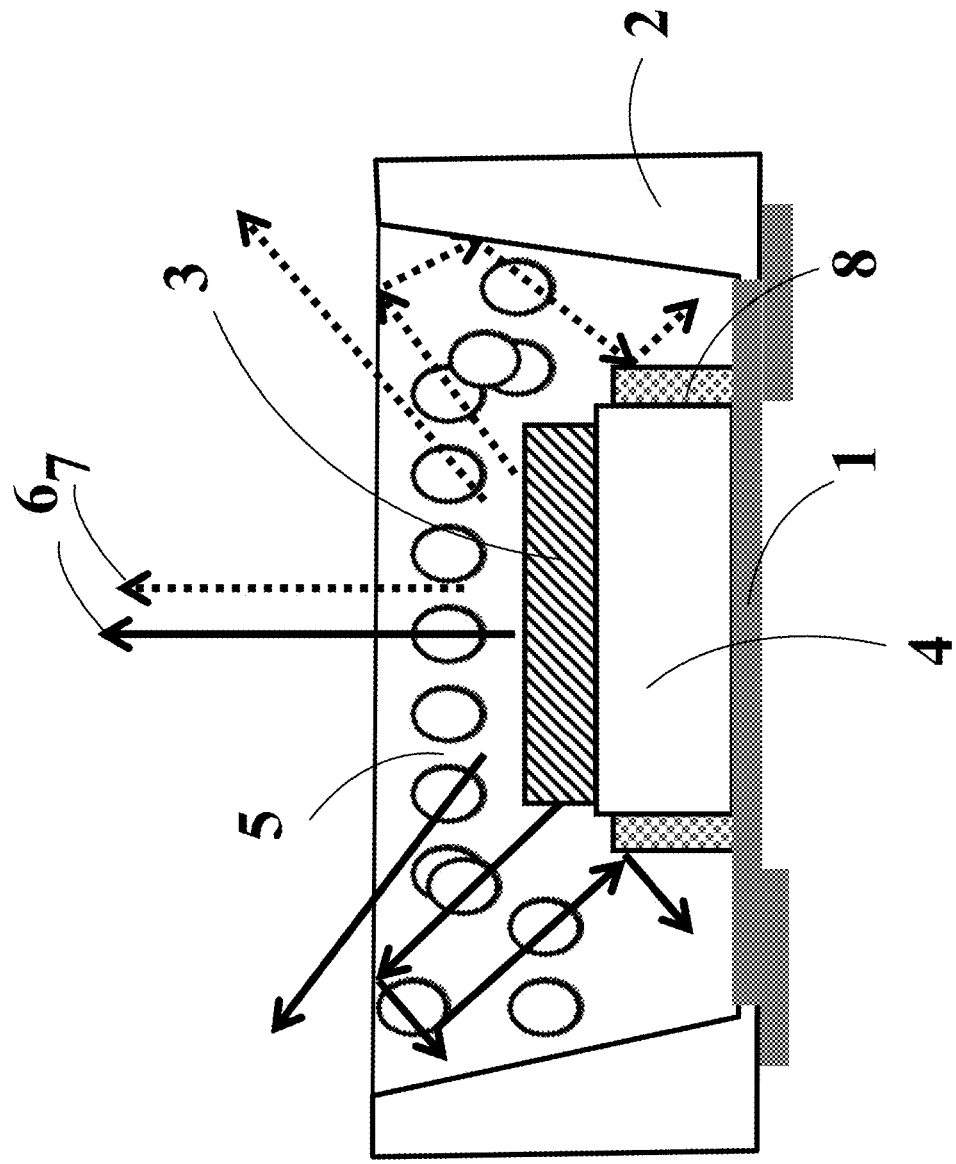
FIG. 3 is a section diagram of LED packaging structure of Embodiment 2.

With reference to FIG. 3, a LED packaging structure, comprising a support system, mainly used for bearing the Si substrate LED vertical chip 4, and the support system is a metal support 1 and the encircling baffle 8 is over the metal support 1, both of which are fabricated separately. The metal support 1 is used for electrode conduction or heat dissipation and the encircling baffle structure 8 is used for eliminating or preventing light reflected by the LED chip being absorbed by the Si substrate and reflecting such light out of the packaging structure; wherein, height of the encircling baffle is more than ½ of thickness of the substrate of the Si substrate LED chip and less than thickness of the substrate of the Si substrate LED chip; glue cup 2 is connected to periphery of the support system and shape of the glue cup can be adjusted based on light shape controlling requirements; the LED vertical chip 4 is placed over the support system through die bonding; the packaging glue with yellow YAG phosphor 5 is evenly distributed over the Si substrate LED chip 4 through coating.

In the above LED packaging structure, size of the encircling baffle structure is to be corresponding to that of the Si substrate LED vertical chip, i.e., periphery size of the encircling baffle structure is larger than or equals to that of the Si substrate LED vertical chip; the encircling baffle surface is a glue cup with surface distributed with reflective material, which can be fabricated separately or at the time of glue cup modeling design.

Embodiment 3

Different from Embodiment 1, in the LED packaging structure of this Embodiment, the gap between the LED chip Si substrate and the encircling baffle is filled with refractive material, e.g., white glue (mirror ink), so as to further reflect the blue light and yellow that may be absorbed by the Si substrate back, thus improving light intensity of the vertical LED chip.

Embodiment 4

Figure 4:
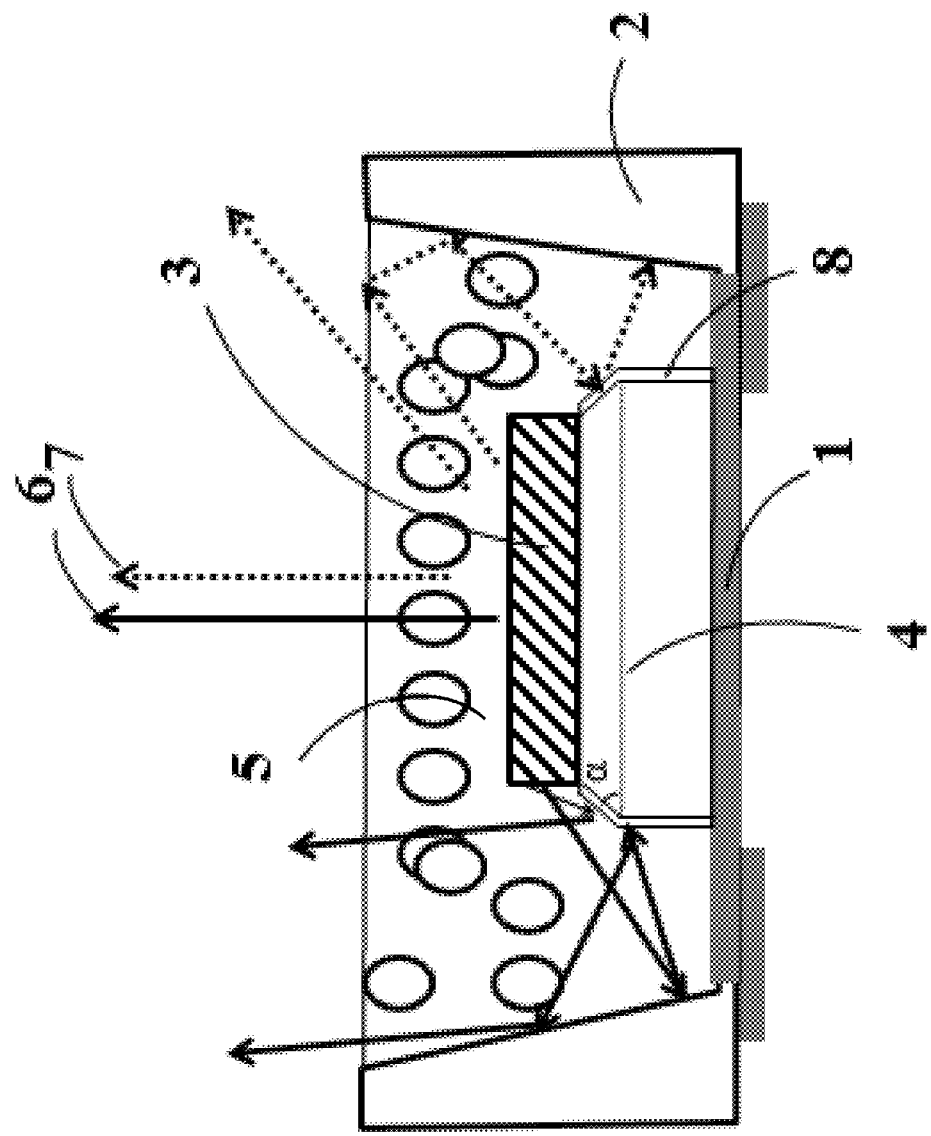
FIG. 4 is a section diagram of LED packaging structure of Embodiment 4.

With reference to FIG. 4, different from Embodiment 2, in the LED packaging structure of this Embodiment, side wall of the LED chip Si substrate 4 has a first side and a second side, in which, the first side is approximate to the LED chip and has an inclined angle with the level surface and the second side is far from the LED chip and is vertical to the level surface. The inclined angle α of the first side ranges from 30° to 85° and is 55° in this Embodiment. The encircling baffle 8 can be a distributed Bragg reflecting layer, a metal reflecting layer or an omni-directional reflecting layer. In this embodiment, a distributed Bragg reflecting layer with alternative high-refractivity material and low-refractivity material is used, which can be formed over the substrate side wall through evaporating or sputtering, i.e., tightly adhering to and cladding the substrate. In this way, by adjusting inclined angle of the first side and in combination of encircling baffle at side of the substrate, more light will be extracted. See FIG. 4 for the light extraction path.

Embodiment 5

Figure 5:
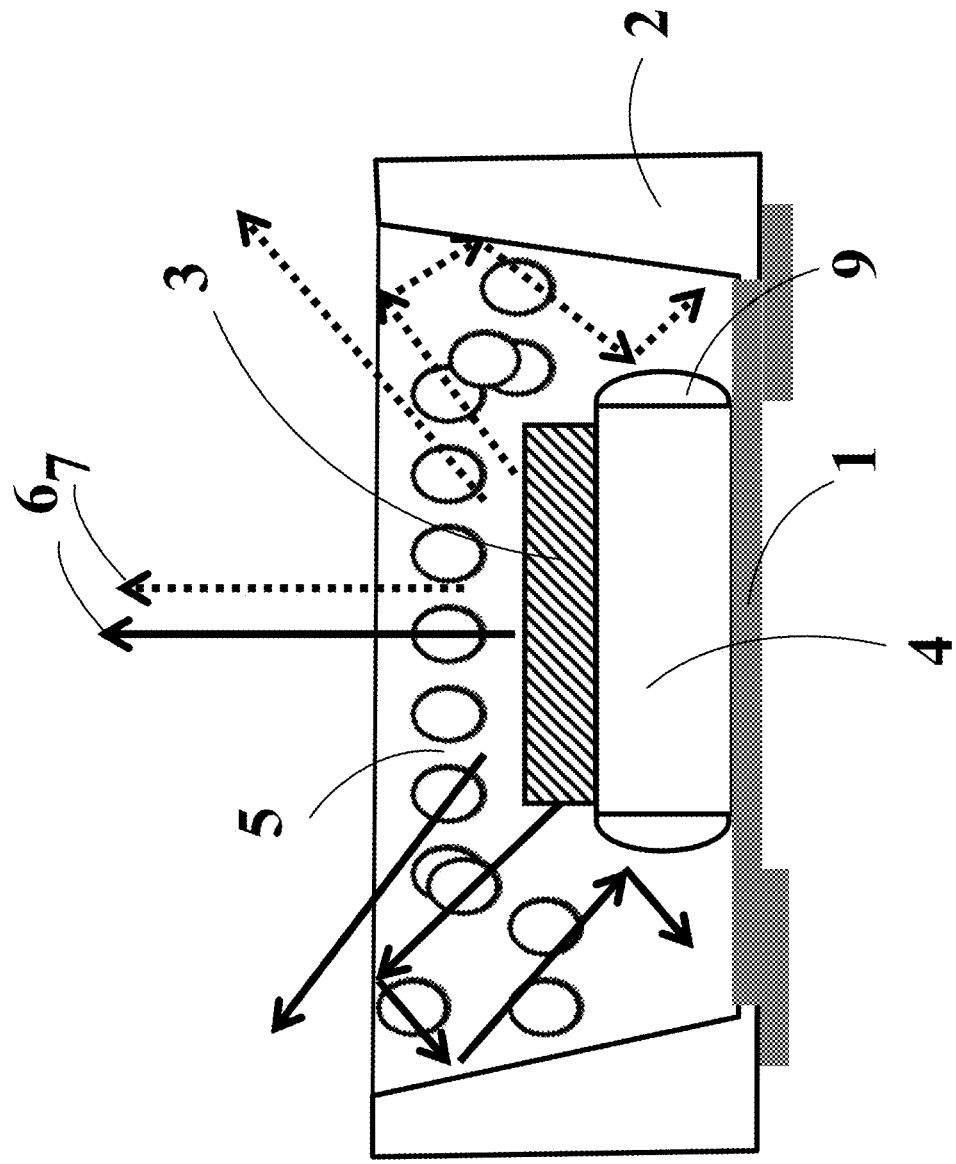
FIG. 5 is a section diagram of LED packaging structure of Embodiment 5.

With reference to FIG. 5, a LED packaging structure of this Embodiment, comprising a support system, mainly used for bearing the Si substrate LED vertical chip 3, and the support system can be the metal support 1 that is used for electrode conduction or heat dissipation; glue cup 2 is connected to periphery of the support system and shape of the glue cup can be adjusted based on light shape controlling requirements; the Si substrate LED chip 3 can be placed over the support system through die bonding; the packaging glue with yellow YAG phosphor 5 is evenly distributed over periphery of the Si substrate LED chip 3 through coating; a bubble structure 9 is formed between the side of the Si substrate 4 with vertical side and the packaging glue 5 interface.

In the above LED packaging structure, a bubble structure 9 is plated with hydrophilic material through the vertical side of Si substrate 4, to make the side not easily to be adhered to the packaging glue. In this embodiment, a reflecting layer is formed by taking advantage of refractivity difference of the packaging glue, bubble and the Si substrate material, which can effectively eliminate or prevent light emitted from LED chip 3 from being absorbed by the Si substrate 4 and reflect such light out of the packaging structure, thus improving light intensity of the vertical LED chip. This packaging structure is suitable for lighting system, in particular for packaging into LED lamp bead.

Embodiment 6

Figure 6:
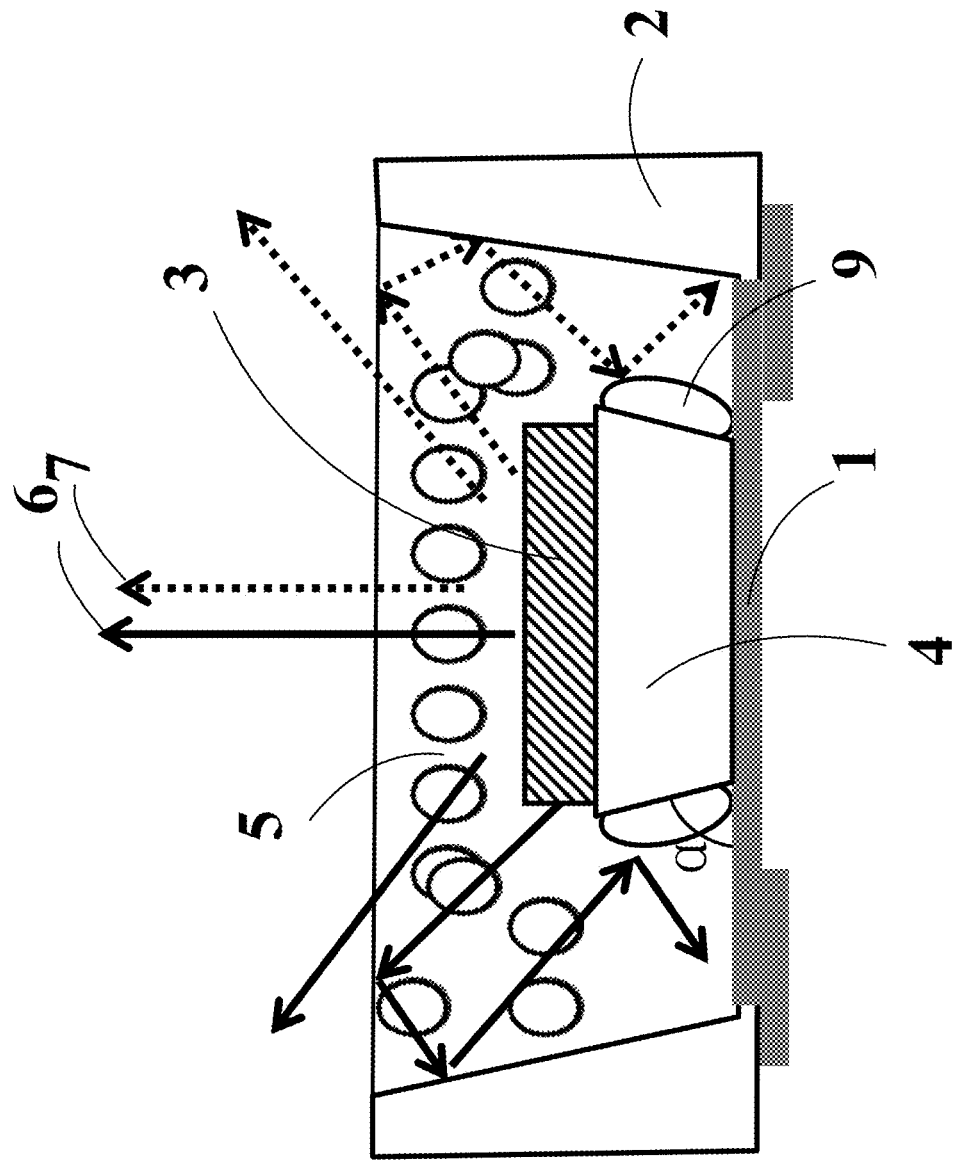
FIG. 6 is a section diagram of LED packaging structure of Embodiment 6.

With reference to FIG. 6, different from Embodiment 5, in the LED packaging structure of this Embodiment, side wall of Si substrate 4 has an inclined angle with level surface and the section gets narrower from up to bottom. The inclined angle α ranges from 5° to 85° and is 60° in this Embodiment.

In this embodiment, since side of the Si substrate 4 has an inclined angle with level surface and the section gets narrower from up to bottom, which makes it easier to form a bubble structure 9 between the side of the Si substrate 4 and the packaging glue 5 interface.

Embodiment 7

With reference to FIG. 7, different from Embodiment 5, in the LED packaging structure of this Embodiment, side wall of the Si substrate 4 has a first side and a second side, in which, the first side is approximate to the LED chip and has an inclined angle with the level surface and the second side is far from the LED chip and is vertical to the level surface. The inclined angle of the first side ranges from 5° to 85° and is 45° in this Embodiment.

In the above LED packaging structure, side of the Si substrate 4 is basically divided into two sections, i.e., the end approximate to the LED chip, which has an inclined angle with the level surface and the section gets narrower from up to bottom; and the other side far from the LED chip, which is vertical to the level surface, and such structure makes it easier to form a bubble structure 9 between the side of the Si substrate 4 and the packaging glue 5 interface.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A light emitting diode packaging structure, comprising:
a support system;
a glue cup coupled to a periphery of the support system;
a LED chip with a light absorption substrate over the support system;
packaging glue distributed at a periphery of the LED chip; and
a bubble structure formed between a downwardly-slanted side of the light absorption substrate and the packaging glue, wherein:
a reflecting layer is formed from material refractivity difference of the packaging glue, the bubble structure and the light absorption substrate for reflecting light, resulting from the material refractivity difference, sideways and outwardly away from the light absorption substrate thereby eliminating or reducing light absorption by the substrate;
the downwardly-slanted side is relative to the LED chip; and
a hydrophilic material is plated at the side of the light absorption substrate to reduce adhesion between the side and the packaging glue thereby facilitate formation of the bubble structure.

2. The light emitting diode packaging structure of claim 1, wherein an end of the light absorption substrate that is adjacent to the LED chip has an inclined angle with the level surface having a section getting narrower from up to bottom, relative to the LED chip, to form the downwardly-slanted side to thereby facilitate formation of the bubble structure.

3. The light emitting diode packaging structure of claim 2, wherein a side wall of the light absorption substrate has a first side that is the downwardly-slanted side and a second side, wherein the first side is adjacent to the LED chip and has an inclined angle with the level surface and the second side is distal from the LED chip and is vertical to the level surface.

4. The light emitting diode packaging structure of claim 3, wherein the inclined angle ranges from 5° to 85°.

5. The light emitting diode packaging structure of claim 4, wherein the inclined angle ranges from 30° to 85°.

6. A light emitting diode packaging structure, comprising:
a support system;
a glue cup coupled to a periphery of the support system;
a LED chip with a light absorption substrate over the support system;

packaging glue distributed at a periphery of the LED chip; and a bubble structure formed between a downwardly-slanted side of the light absorption substrate and the packaging glue, wherein:
a reflecting layer is formed from material refractivity difference of the packaging glue, the bubble structure and the light absorption substrate for reflecting light, resulting from the material refractivity difference, sideways and outwardly away from the light absorption substrate thereby eliminating or reducing light absorption by the substrate;
the downwardly-slanted side is relative to the LED chip;
the light absorption substrate has a vertical side in addition to the downwardly-slanted side, and wherein the bubble structure covers completely the downwardly-slanted side at least in a cross section.

7. A lighting system with a LED packaging structure, the LED packaging structure comprising:
a support system;
a glue cup coupled to a periphery of the support system;
an LED chip with a light absorption substrate over the support system;
packaging glue distributed at a periphery of the LED chip; and
a bubble structure formed between a downwardly-slanted side of the light absorption substrate and the packaging glue, wherein:
the light absorption substrate has the downwardly-slanted side plated with a hydrophilic material to reduce adhesion between the side and the packaging glue;
a reflecting layer is formed from material refractivity difference of the packaging glue, the bubble structure and the light absorption substrate for reflecting light, resulting from the material refractivity difference, sideways and outwardly away from the light absorption substrate thereby eliminating or reducing light absorption by the substrate;
the downwardly-slanted side is relative to the LED chip;
the light absorption substrate has a vertical side in addition to the downwardly-slanted side, and wherein the bubble structure covers completely the downwardly-slanted side at least in a cross section.

8. The lighting system of claim 7 wherein the packaging structure is an LED lamp bead structure.

9. The lighting system of claim 7, wherein the light absorption substrate is a Si substrate.

* * * * *